(12) United States Patent
Im

(10) Patent No.: US 9,159,438 B2
(45) Date of Patent: Oct. 13, 2015

(54) NAND FLASH MEMORY HAVING C/A PIN AND FLASH MEMORY SYSTEM INCLUDING THE SAME

(71) Applicant: Jeon-Taek Im, Anseong-Si (KR)

(72) Inventor: Jeon-Taek Im, Anseong-Si (KR)

(73) Assignee: Samsung Electronics, Co., Ltd., Yeongtong-Gu, Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/926,693

(22) Filed: Jun. 25, 2013

(65) Prior Publication Data

US 2013/0286737 A1    Oct. 31, 2013

Related U.S. Application Data

(63) Continuation of application No. 11/757,121, filed on Jun. 1, 2007.

(30) Foreign Application Priority Data

Dec. 29, 2006  (KR) .......................... 10-2006-0137629

(51) Int. Cl.
*G06F 12/00*  (2006.01)
*G11C 16/26*  (2006.01)
*G11C 5/02*  (2006.01)
(Continued)

(52) U.S. Cl.
CPC  *G11C 16/26* (2013.01); *G11C 5/02* (2013.01); *G11C 5/04* (2013.01); *G11C 7/109* (2013.01); *G11C 7/1042* (2013.01); *G11C 7/1051* (2013.01); *G11C 7/1063* (2013.01); *G11C 7/1078* (2013.01); *G11C 16/06* (2013.01); *G06F 12/0246* (2013.01); *G06F 12/0623* (2013.01); *G06F 12/0804* (2013.01)

(58) Field of Classification Search
CPC ............ G06F 12/0246; G06F 12/0623; G06F 12/0804
See application file for complete search history.

(56) References Cited

U.S. PATENT DOCUMENTS 5,379,401 A  1/1995  Robinson et al.
5,966,723 A  10/1999 James et al.
(Continued)

FOREIGN PATENT DOCUMENTS

JP    09-139483        5/1997
JP    2003-109384      4/2003
KR    1020050035836    4/2005

OTHER PUBLICATIONS

English Abstract for Publication No. 09-139483.
(Continued)

*Primary Examiner* — Cheng-Yuan Tseng
*Assistant Examiner* — Arvind Talukdar
(74) *Attorney, Agent, or Firm* — F. Chau & Associates, LLC

(57) ABSTRACT

A NAND flash memory in which a command/address pin is separated from a data input/output pin. The NAND flash memory includes a memory cell array used for storing data, a command/address pin through which a command and an address are received for transmitting data in the memory cell array, and a data input/output pin through which data are transmitted in the memory cell array. The command/address pin is separated from the data input/output pin in the NAND flash memory. Data input/output speed is increased. Furthermore, the NAND flash memory can perform a bank interleaving operation with a minimal delay time.

19 Claims, 15 Drawing Sheets

(51) Int. Cl.
*G11C 5/04* (2006.01)
*G11C 7/10* (2006.01)
*G11C 16/06* (2006.01)
*G06F 12/06* (2006.01)
*G06F 12/08* (2006.01)
*G06F 12/02* (2006.01)

(56) References Cited

U.S. PATENT DOCUMENTS

| | | |
|---|---|---|
| 6,519,194 B2 | 2/2003 | Tsujino et al. |
| 6,614,683 B1 | 9/2003 | Parker |
| 6,724,682 B2 | 4/2004 | Lee et al. |
| 6,851,018 B2 | 2/2005 | Wyatt et al. |
| 6,965,964 B2 | 11/2005 | Lee et al. |
| 7,405,992 B2 * | 7/2008 | Oh .......................... 365/230.02 |
| 2003/0202383 A1 * | 10/2003 | Shiota et al. ............. 365/185.33 |
| 2004/0062126 A1 * | 4/2004 | Takemae ....................... 365/222 |
| 2004/0133758 A1 * | 7/2004 | Matsuda ....................... 711/167 |
| 2004/0151053 A1 | 8/2004 | Peterson |
| 2004/0168016 A1 | 8/2004 | Roohparvar |
| 2005/0135145 A1 * | 6/2005 | Lee et al. ...................... 365/154 |
| 2005/0204091 A1 | 9/2005 | Kilbuck et al. |
| 2005/0219907 A1 | 10/2005 | Roohparvar |
| 2005/0223158 A1 * | 10/2005 | See et al. ...................... 711/103 |
| 2006/0195650 A1 * | 8/2006 | Su et al. ....................... 711/103 |
| 2007/0005923 A1 * | 1/2007 | Ito .............................. 711/167 |
| 2008/0028131 A1 | 1/2008 | Kudo et al. |
| 2008/0109582 A1 * | 5/2008 | Chen ............................. 710/61 |

OTHER PUBLICATIONS

English Abstract for Publication No. 2003-109384.
English Abstract for Publication No. 1020050035836.

\* cited by examiner

| Pin Name | Description |
|---|---|
| RnB | Ready, Busy Status Out |
| nRE | Read Enable |
| nCE | Chip Enable |
| Vcc | Power Supply |
| Vss | Ground |
| CLE | Command Latch Enable |
| ALE | Address Latch Enable |
| nWE | Write Enable |
| nWP | Write Protection |
| DQ0~DQ7 | Data Input & Output |

| Pin Name | Description |
|---|---|
| C/A0~C/A3 | Command/Address Mux |
| nLOAD | Load Command or Address |
| nCE | Chip Enable |
| CLK | Clock |
| Vcc | Power Supply |
| Vss | Ground |
| SQ | Status Out |
| DQS | Strobe for Data I/O |
| DQ0~DQ7 | Data Input & OutPut |

Fig. 17

| Pin | Name | Description |
|---|---|---|
| #1 | C/A3 | Command/Address Mux |
| #2 | C/A2 | Command/Address Mux |
| #3 | C/A1 | Command/Address Mux |
| #4 | C/A0 | Command/Address Mux |
| #5 | nLOAD | Load Command or Address |
| #6 | nCE | Chip Enable |
| #7 | CK | Clock |
| #8 | VSS | Ground for Core |
| #9 | NC | No Connection |
| #10 | DQ7 | Data Input & OutPut |
| #11 | DQ6 | Data Input & OutPut |
| #12 | DQ5 | Data Input & OutPut |
| #13 | DQ4 | Data Input & OutPut |
| #14 | VDDQ | Power Supply for DQ |
| #15 | DQS | Strobe for Data Input & Output |
| #16 | VSSQ | Ground for DQ |
| #17 | DQ3 | Data Input & OutPut |
| #18 | DQ2 | Data Input & OutPut |
| #19 | DQ1 | Data Input & OutPut |
| #20 | DQ0 | Data Input & OutPut |
| #21 | VDD | Power Supply for DQ |
| #22 | SQ | Status Out(Not DDR, Clock to Data Out) |
| #23 | nCKE | Clock Enable(Clock Stop When High) |
| #24 | WP | Write Protection |

NAND FLASH MEMORY HAVING C/A PIN AND FLASH MEMORY SYSTEM INCLUDING THE SAME

CROSS-REFERENCE TO RELATED APPLICATIONS

This application is a Continuation of U.S. patent application Ser. No. 11/757,121, filed Jun. 1, 2007, which claims priority under 35 U.S.C. §119 to Korean Patent Application No. 10-2006-0137629, filed on Dec. 29, 2006, the entire contents of which are hereby incorporated by reference.

BACKGROUND OF THE INVENTION

1. Technical Field

The present disclosure relates to a memory device, and more particularly, to a NAND flash memory having a command/address (C/A) pin and a flash memory system including the same.

2. Discussion of the Related Art

Semiconductor memory devices are storage devices for storing data. Semiconductor memory devices can be classified as a random access memory (RAM) and a read only memory (ROM). A RAM is a volatile memory device that requires power to maintain stored data. A ROM is a nonvolatile memory device that can maintain stored data even when not powered.

Examples of RAMs include a dynamic RAM (DRAM) and a static RAM (SRAM). Examples of ROMs include a programmable ROM (PROM), an erasable programmable ROM (EPROM), an electrically erasable programmable ROM (EEPROM), and a flash memory. Examples of flash memories include a NOR flash memory and a NAND flash memory. NAND flash memories are widely used for mobile communication terminals, portable media players, digital cameras, and mobile storage media.

FIG. 1 illustrates a conventional NAND flash memory 100, and FIG. 2 is a table providing descriptions of pins of the NAND flash memory 100. Referring to FIG. 1, the NAND flash memory 100 includes control pins such as RnB, ALE, CLE, nWE, and nCE pins that are formed on a first surface 110 of the NAND flash memory 100. The NAND flash memory 100 further includes data pins such as DQ0 through DQ7 pins formed on a to second surface 120.

The pin structure of the NAND flash memory 100 shown in FIG. 1 is a structure for a thin small outline package (TSOP). However, since the control pins are formed on one surface of the NAND flash memory 100, board structure for the NAND flash memory 100 is complicated. Furthermore, when a memory module is formed using a plurality of NAND flash memories having the pin structure illustrated in FIG. 1, the structure of a printed circuit board (PCB) for the memory module is complicated.

FIG. 3 is a block diagram illustrating a flash memory system 200 having a multi-bank architecture using the NAND flash memory 100 of FIG. 1. Referring to FIG. 3, the flash memory system 200 may include a flash controller 250, first bank 210, second bank 220, third bank 230, and fourth bank 240.

Each of the banks 210, 220, 230, and 240 includes four NAND flash memories. For example, the first bank 210 includes four NAND flash memories 211, 212, 213, and 214. The second bank 220 includes four NAND flash memories 221, 222, 223, and 224. The third bank 230 includes four NAND flash memories 231, 232, 233, and 234. The fourth bank 240 includes four NAND flash memories 241, 242, 243, and 244. The flash controller 250 is connected to the banks 210, 220, 230, and 240 through four channels 1 through 4. Here, each of the channels 1 through 4 connects corresponding NAND flash memories of the banks 210, 220, 230, and 240. For example, channel 1 connects NAND flash memories 211, 221, 231, and 241 of the banks 210, 220, 230, and 240, respectively.

Similarly, channel 2 connects NAND flash memories 212, 222, 232, and 242. Channel 3 connects NAND flash memories 213, 223, 233, and 243. Channel 4 connects NAND flash memories 214, 224, 234, and 244.

The controller 250 performs a bank interleaving operation using chip enable signals nCE0-nCEX (where X is a positive integer). In so doing, the controller 250 receives as many enable signals and read and busy signals RnB0-RnBX as there are NAND flash memories. As used herein, bank interleaving is a data reading or writing operation performed between banks of a memory system in which two or more banks share a common channel. For example, in a bank interleaving operation, the flash controller 250 reads data from and/or writes data to the NAND flash memories 211, 221, 231, and 241 connected to channel 1 while moving between the NAND flash memories 211, 221, 231, and 241.

As described above, as many chip enable signals nCE0 to nCEX and ready and busy signals RnB0 to RnBX are used as the number of flash memory chips for a bank interleaving operation. Therefore, when the flash memory system 200 uses all the four channels 1 to 4, sixteen chip enable signals nCE0 to nCE15 and sixteen read and busy signals RnB0 to RnB15 are used for a bank interleaving operation. Accordingly, the structure of the flash memory system 200 becomes more complicated as the numbers of banks and flash memory chips increase.

A conventional NAND flash memory receives address and command signals through a data input/output (DQ) pin. Therefore, when address and command signals are input to the NAND flash memory, data cannot be input to or output from the NAND flash memory. This results in a data delay time Data input/output is especially delayed when a bank interleaving operation is performed.

Furthermore, when data is written to or read from a cell array of a conventional NAND flash memory, RnB signals are generated. In this case, a flash controller cannot perform any operation until the writing/reading operation is completed. This reduces the performance of a flash memory system.

SUMMARY OF THE INVENTION

Exemplary embodiments of the present invention provide a NAND flash memory having fast data input/output.

Exemplary embodiments of the present invention provide a flash memory system that performs a bank interleaving operation while minimizing delay time.

Exemplary embodiments of the present invention provide NAND flash memories including a memory cell array used for storing data, a command/address pin through which a command and an address are received for inputting data to or outputting data from the memory cell array, and a data input/output pin through which data are input to or output from the memory cell array.

In some exemplary embodiments, the NAND flash memory further includes a status register receiving a status read command through the command/address pin and providing an operational status of the NAND flash memory to a flash controller. The flash controller sends the status read command to the NAND flash memory when the NAND flash memory operates, before the NAND flash memory operates, or after the NAND flash memory operates. The status register sends a status signal SQ to the flash controller to inform the flash controller whether the NAND flash memory is internally operational. The flash controller controls the internal operation of the NAND flash memory in response to the status signal SQ.

In some exemplary embodiments, the data is input/output through the data input/output pin depending upon the toggling of a data strobe signal DQS. The data is input/output through the data input/output pin by a DDR (double data rate) transmission method. The NAND flash memory further includes a command/address buffer receiving to the command and address transmitted through command/address pin. The NAND flash memory further includes a control unit controlling the reception of the command and address. The control unit receives a chip enable signal nCE and a load signal nLOAD from a flash controller and controls the reception of the command and address.

In some exemplary embodiments of the present invention, there are provided flash memory systems including a flash controller and a flash memory module formed of a plurality of NAND flash memories. Each of the NAND flash memories includes a memory cell array used for storing data, a command/address pin through which a command and an address are received from the flash controller for inputting/outputting data to/from the memory cell array and a data input/output pin through which data are input to and output from the memory cell array.

In some exemplary embodiments, each of the NAND flash memories further includes a status register receiving a status read command through the command/address pin and providing an operational status of the NAND flash memory to the flash controller. The flash controller sends the status read command to the NAND flash memory when the NAND flash memory operates, before the NAND flash memory operates or after the NAND flash memory operates. The status register sends a status signal SQ to the flash controller to inform the flash controller whether the NAND flash memory is internally operational. The flash controller controls the internal operation of the NAND flash memory in response to the status signal SQ. The data input/output through the data input/output pin is performed according to a toggling of a data strobe signal DQS. The data input/output through the data input/output pin is performed by a DDR transmission method. Each of the NAND flash memories further includes a command/address buffer receiving the command and address transmitted through command/address pin. Each of the NAND flash memories further includes a control unit controlling the reception of the command and address. The control unit receives a chip enable signal nCE and a load signal nLOAD from the flash controller and controls the reception of the command and address.

BRIEF DESCRIPTION OF THE FIGURES

The above and other features of the present disclosure will become more apparent by describing in detail exemplary embodiments of the present invention with reference to the attached drawings in which:

FIG. 17 is a table illustrating pins of the TSOP of FIG. 16, according to an exemplary embodiment of the present invention.

DETAILED DESCRIPTION OF EXEMPLARY EMBODIMENTS

Exemplary embodiments of the present invention will be described below in more detail with reference to the accompanying drawings. The present invention may, however, be embodied in different forms and should not be construed as limited to the exemplary embodiments set forth herein.

Figures 1, 2:
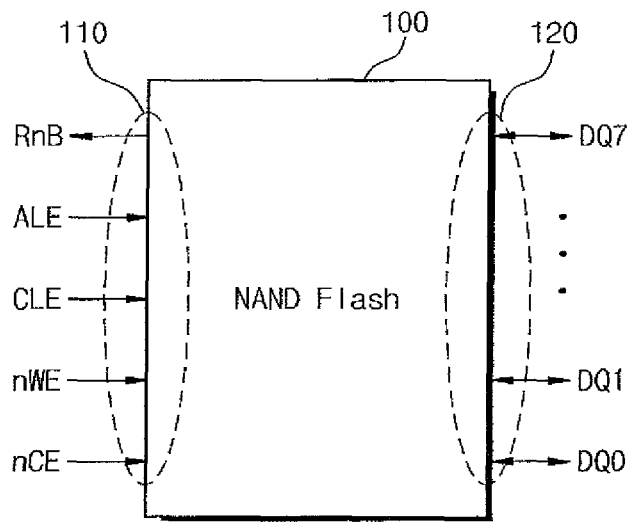
FIG. 1 illustrates a conventional NAND flash memory.
FIG. 2 is a table illustrating pins of the NAND flash memory of FIG. 1.
Figure 3:
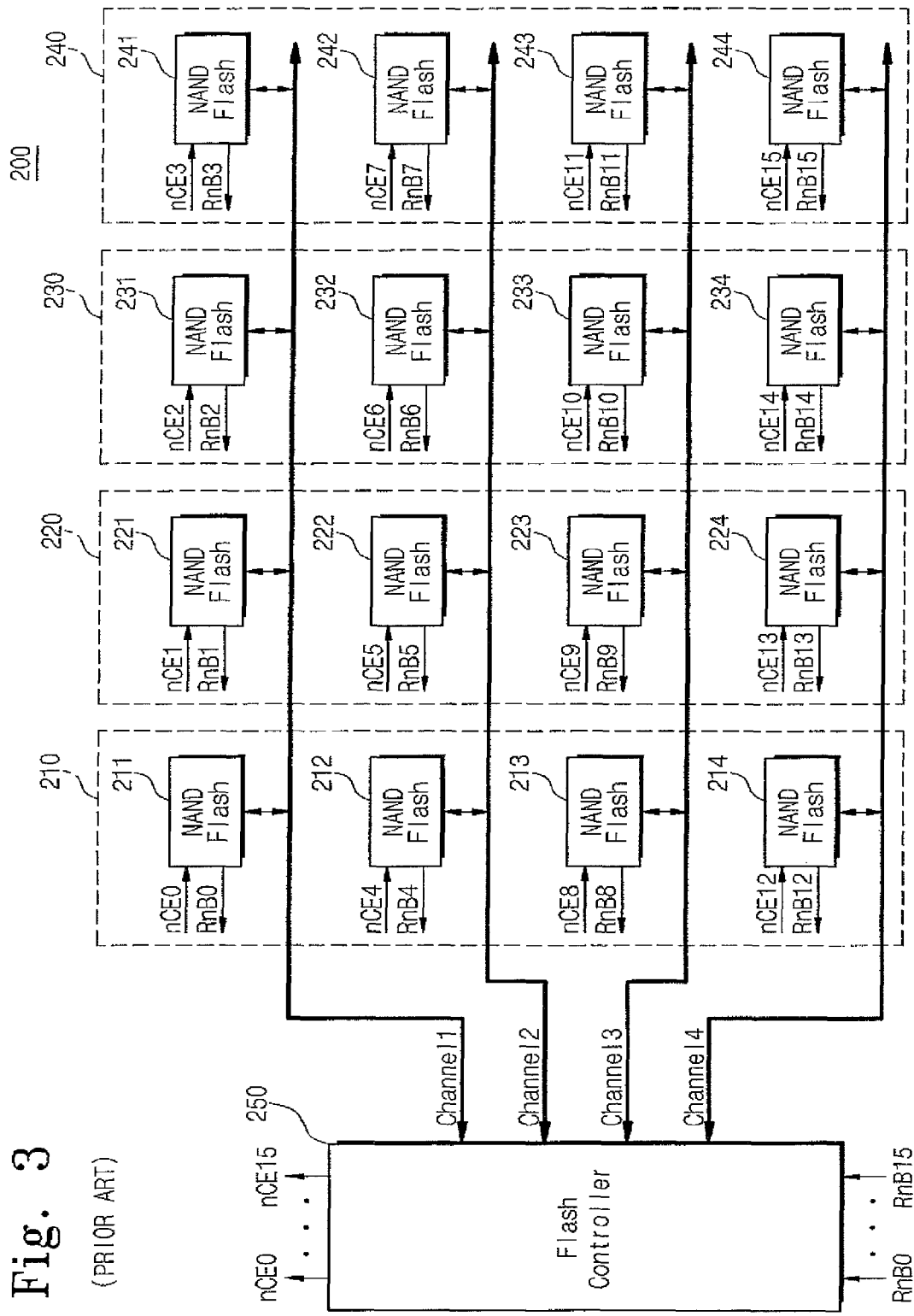
FIG. 3 is a block diagram illustrating a flash memory system with a multi-bank architecture using the NAND flash memory of FIG. 1.
Figures 4, 5:
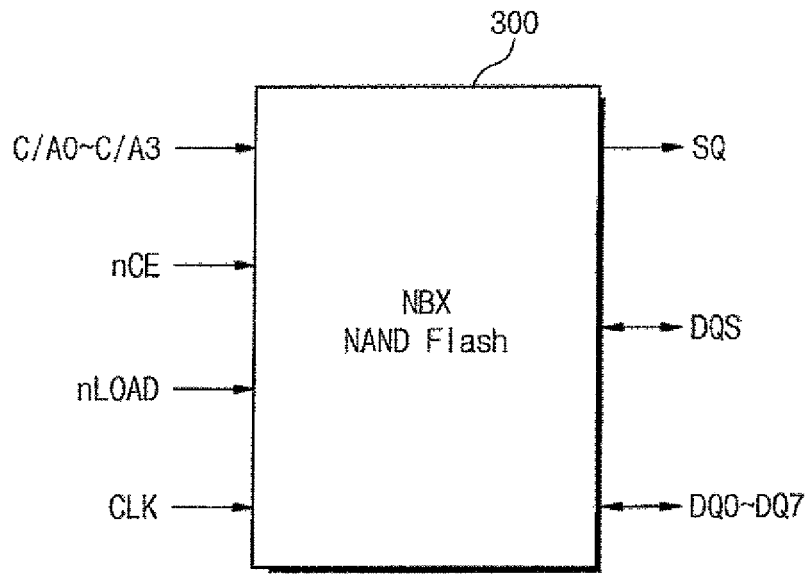
FIG. 4 illustrates an NBX NAND flash memory according to an exemplary embodiment of the present invention.
FIG. 5 is a table providing descriptions of pins of the NBX NAND flash memory of FIG. 4, according to an exemplary embodiment of the present invention.

FIG. 4 illustrates a NAND flash memory 300 according to an exemplary embodiment of the present invention, and FIG. 5 is a table illustrating pins of the NBX NAND flash memory 300 according to an exemplary embodiment of the present invention. The NAND flash memory 300 includes additional command/address pins C/A0 to C/A3. The NAND flash memory 300 further includes a data strobe pin DQS in addition to data input/output pins DQ0 to DQ7 for input/output data synchronization. Input signals of the NAND flash memory 300 are synchronized with a clock (CLK) signal. The NAND flash memory 300 of FIG. 4 will now be referred to as a NAND bus scaleable (NBX) NAND flash memory.

Referring to FIG. 5, the command/address pins C/A0 to C/A3 are used for inputting command and address signals. Although four command/address pins C/A0 to C/A3 are shown in FIG. 5, the number of command/address pins C/A0 to C/A3 can be increased. The nLOAD pin is used for loading a command or address signal to the NAND flash memory 300. The nCE pin is a chip enable pin. The CLK pin is a clock pin. The Vcc pin is a power voltage pin, and the Vss pin is a ground voltage pin.

The SQ pin indicates which operation is being performed or is completed in the NBX NAND flash memory 300. For example, a high SQ signal indicates that an operation is completed in the NBX NAND flash memory 300 and the NBX NAND flash memory 300 is ready for the next operation. A low SQ signal indicates that an operation is being performed in the NBX NAND flash memory 300. The SQ signal is output in synchronization with a CLK signal. As described above, the DQS pin is a data strobe pin used for data input/output, and the DQ0 to DQ7 pins are data input/output pins.

Figure 6:
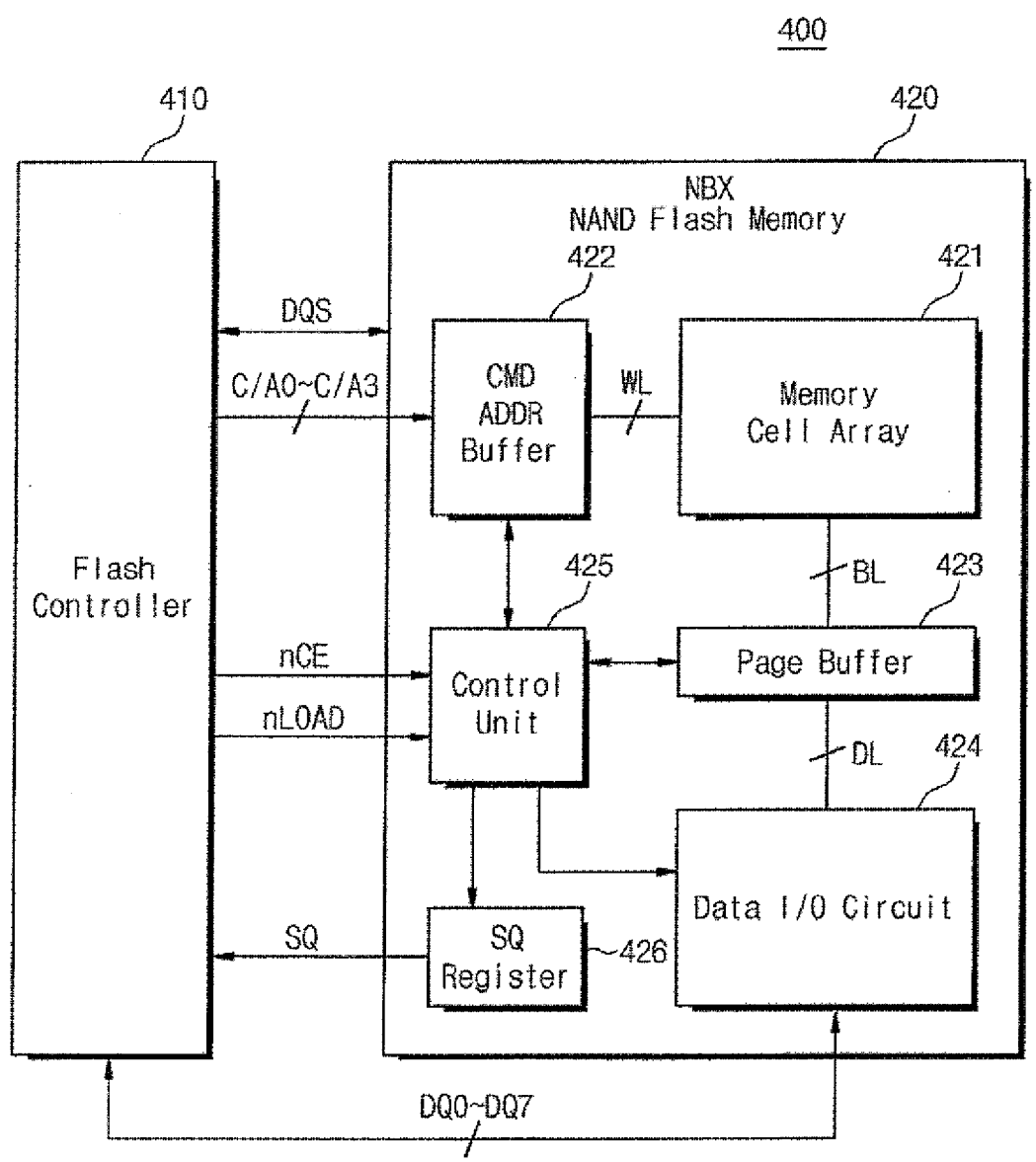
FIG. 6 is a block diagram of an NBX NAND flash memory system illustrating the NBX NAND flash memory of FIG. 4, according to an exemplary embodiment of the present invention.

FIG. 6 is a block diagram of an example of the NBX NAND flash memory of FIG. 4, according to an exemplary embodiment of the present invention. The NBX NAND flash memory 420 is electrically connected to a flash controller 410. The NBX NAND flash memory 420 receives address and command signals from the flash controller 410 through a C/A pin and receives data from and sends data to the flash controller 410 through a data input/output pin.

Referring to FIG. 6, the NBX NAND flash memory 420 includes a memory cell array 421, a command address buffer 422, a page buffer 423, a data input/output circuit 424, a control unit 425, and an SQ register 426.

The memory cell array 421 includes a plurality of memory blocks (not shown). Each of the memory blocks includes a plurality of pages (not shown). Each of the pages includes a plurality of memory cells that share a word line. The size of each page may be 512 bytes, 2 KB, or 4 KB. The size of page varies according to the type of the flash memory. In the NBX NAND flash memory 420, data are erased in units of a block, and data are read and written in units of a page.

The command address buffer 422 is connected to the memory cell array 421 through a word line WL. The command address buffer 422 receives a command or address signal from the flash controller 410. The control unit 425 receives control signals nCE and nLOAD and controls the command address buffer 422.

The command signal is input to the NBX NAND flash memory 420 when the control signals nCE and nLOAD are low. Table 1 shows examples of command and control signals used in the NBX NAND flash memory system 400. In Table 1, nCKE denotes a clock enable signal.

TABLE 1

| Command(4bits) | Code | nCKE | nCE | nLOAD | DQS | DQ | Clock Cycle |
|---|---|---|---|---|---|---|---|
| Chip Deselect | — | L | H | X | High-Z | High-Z | L->H |
| Clock Stop | — | H | X | X | High-Z | X | X(after n cycles) |
| Power On | — | H | H | X | High-Z | High-Z | Stead State After n cycles |
| Read | 0h | L | L | L | High-Z | High-Z | L->H, 1$^{st}$ cycle: Read in (after that address in) |
| Read Enable | 1h | L | L | L | Toggle | Data out | L->H, 1$^{st}$ cycle: Read enable (after that read data out) |
| Program (White) | 2h | L | L | L | High-Z | High-Z | L->, 1 cycle: Program Command (after that address in) |
| Program Enable | 3h | L | L | L | Toggle | Data-in | L->H, 1$^{st}$ cycle: command in (after that program the page) |
| Page Read Stop | 4h | L | L |  | High-Z | High-Z | L->H, 1 cycle |
| Page Write Stop | 5h | L | L |  | High-Z | High-Z | L->H, 1 cycle |
| ID Read | 6h | L | L |  | Toggle | Data Out | L->H, 1$^{st}$ cycle: cmd in |
| Register Configuration | 7h | L | L |  | Toggle | Data In | L->H, 1$^{st}$ cycle: cmd in (after that configuration for n cycles) |
| Status Read | 8h | — | — |  | High-Z | High-Z | L->H, 1$^{st}$ cycle: cmd in, 2$^{nd}$ cycle: status data out |
| Reserved | 9h-Eh |  |  |  |  |  |  |
| Reset | Fh |  | L | L | High-Z | High-Z | After n cycles |

Referring to Table 1, Read is a command for starting a read operation. Read Enable is a command for reading data. Write is a command for starting a write operation. Write Enable or Program Enable is a command for writing data into the memory cell array 421.

Status Read is a command for checking the operation status of the NBX NAND flash memory 420. Reset is a command for initializing the NBX NAND flash memory 420.

For example, a read command is input to the NBX NAND flash memory 420 in one clock cycle when nCE and nLOAD signals are low. Next, an address is input to the NBX NAND flash memory 420. Other commands are input to the NBX NAND flash memory 420 in the same manner.

Referring again to FIG. 6, the NBX NAND flash memory 420 includes the SQ register 426. The SQ register 426 stores the status of the NBX NAND flash memory 420. When a status read command is input, the SQ register 426 sends a status signal SQ to the flash controller 410 under the control of the control unit 425.

The status signal SQ is sent to the flash controller 410 to inform the flash controller 410 of the status of the NBX NAND flash memory 420. For example, when the NBX NAND flash memory 420 does not perform any operation, the status signal SQ is high, and when the NBX NAND flash memory 420 performs an operation, the status signal SQ is low. The status signal is generated in synchronization with a CLK signal. Referring to Table 1, after a status read command is input and one cycle passes, a state signal SQ is output. The flash controller 410 can provide the status signal SQ to the flash memory at anytime.

An address is input from the first clock cycle after a command is input. The bit size of the address is determined by an nLOAD signal. Erase, write, and read operations of the NBX NAND flash memory 420 of FIG. 6 will now be described with reference to FIGS. 7 through 9.

Figure 7:
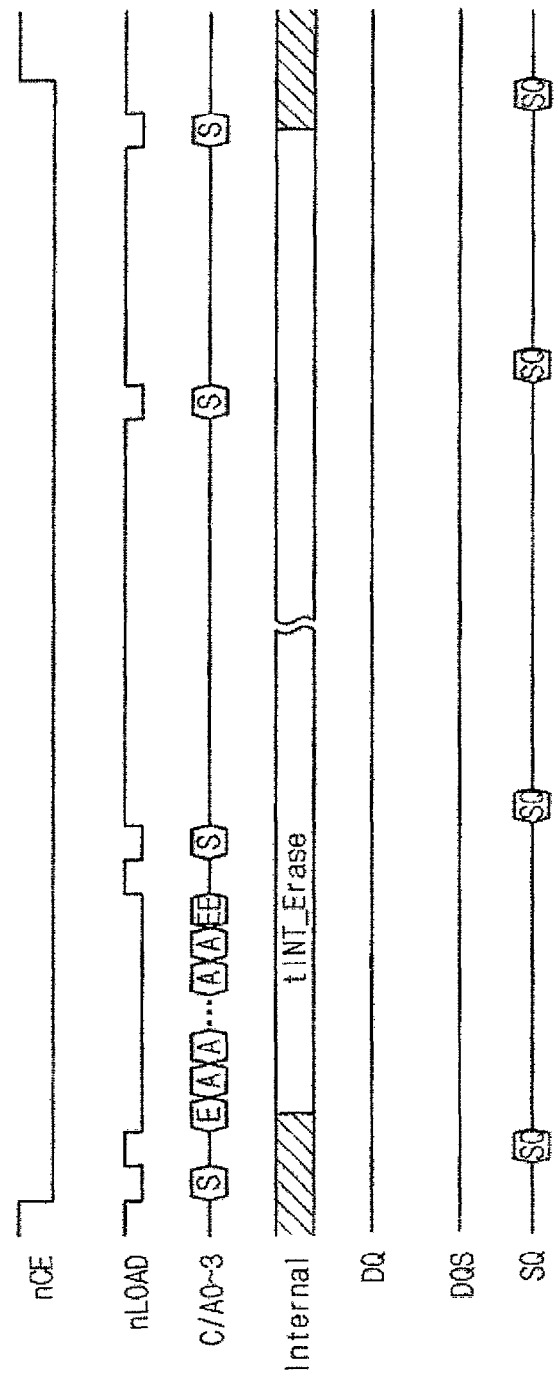
FIG. 7 is a timing diagram showing how data are erased from the NBX NAND flash memory of FIG. 6, according to an exemplary embodiment of the present invention.

FIG. 7 is a timing diagram illustrating how data are erased from the NBX NAND flash memory 420 of FIG. 6, according to an exemplary embodiment of the present invention. Referring to FIG. 7, when an nCE signal and an nLOAD signal are low, a command or an address is input through a CIA pin.

Referring to FIG. 7, S denotes a status read command, E denotes an erase command, A denotes an address, and EE denotes an erase enable command. The status read command S can be input regardless of whether an erase operation is performed. When the status read command S is input, the NBX NAND flash memory 420 generates a status signal SQ after one clock cycle.

The NBX NAND flash memory 420 starts a read operation in response to an erase command. When an erase command is input, an address A is input through the C/A pin. After the address is completely input, an erase enable command EE is input The NBX NAND flash memory 420 erases data from a memory block corresponding to the address A in response to the erase enable command EE.

During the erase operation, the NBX NAND flash memory 420 generates a status signal SQ in response to a status read command S to indicate its status (erase status). After the erase operation, the NBX NAND flash memory 420 generates a status signal SQ in response to a status read command S to indicate its status (end of erase operation).

Figure 8:
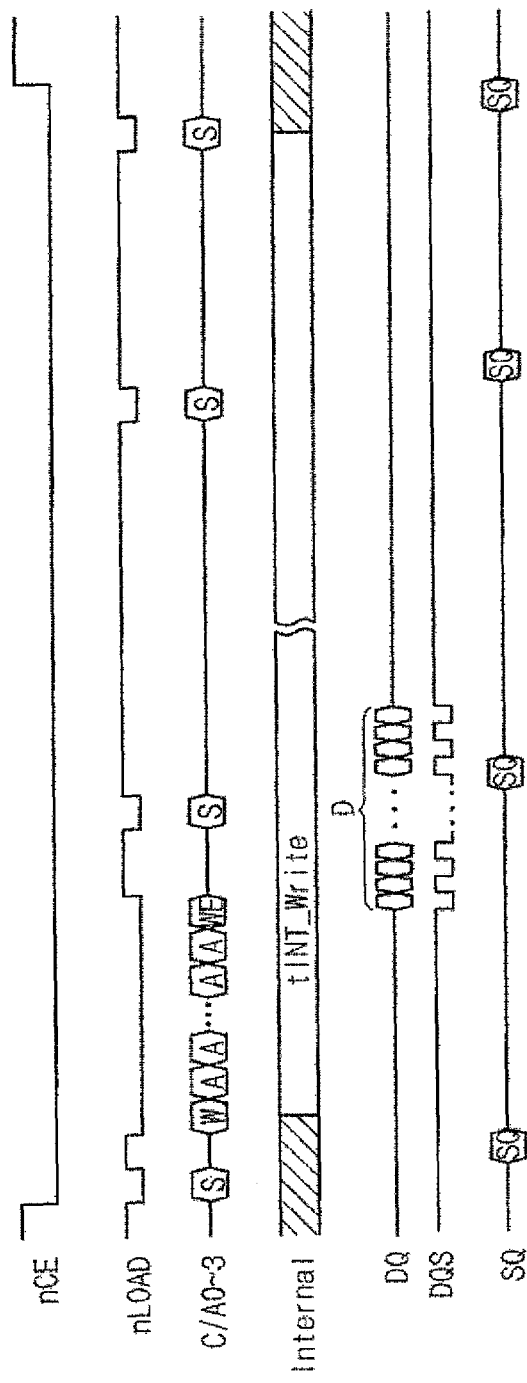
FIG. 8 is a timing diagram for explaining how data are written into the NBX NAND flash memory of FIG. 6, according to an exemplary embodiment of the present invention.

FIG. 8 is a timing diagram for explaining how data are written into the NBX NAND flash memory 420 of FIG. 6, according to an exemplary embodiment of the present invention. Referring to 8, when an nCE signal and an nLOAD signal are low, a command or an address is input through a C/A pin.

In FIG. 8, W denotes a write command, A denotes an address, and WE denotes a write enable command. Here, a status read command S can be input regardless of whether a write operation is performed. When the status read command S is input, the NBX NAND flash memory 420 generates a status signal SQ after one clock cycle.

The NBX NAND flash memory 420 starts a write operation in response to a write command W. After a write command W and an address A are input, a write enable command WE is input. After that, the NBX NAND flash memory 420 receives data through a data input/output (DQ) pin according to the toggling of a data strobe (DQS) signal. Data are input to or output from the NBX NAND flash memory 420 in synchronization with the DQS signal. Referring to FIG. 8, data are transferred twice per one period of the DQS signal by a double data rate (DDR) transmission method.

After the data are received, the NBX NAND flash memory 420 performs programming on a page corresponding to the address A using the received data. During the write operation, the NBX NAND flash memory 420 generates a status signal SQ in response to a status read command S to indicate its status (write status). After the write operation, the NBX NAND flash memory 420 generates a status signal SQ in response to a status read command S to indicate its status (end of write operation).

Figure 9:
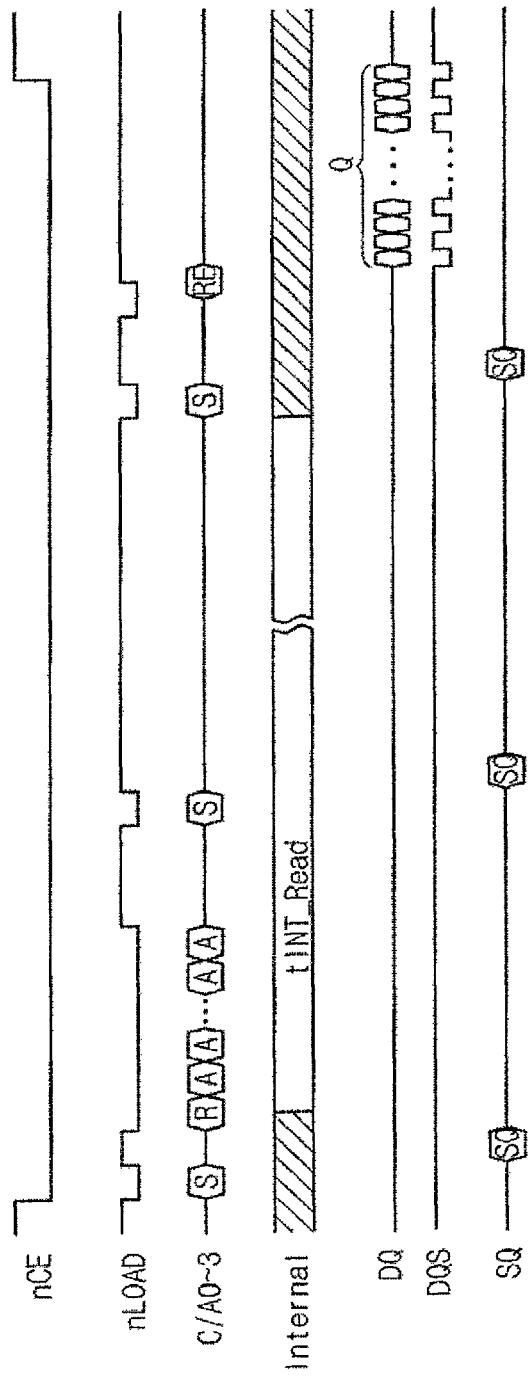
FIG. 9 is a timing diagram for explaining how data are read from the NBX NAND flash memory of FIG. 6, according to an exemplary embodiment of the present invention.

FIG. 9 is a timing diagram for explaining how data are read from the NBX NAND flash memory 420 of FIG. 6, according to an exemplary embodiment of the present invention. In FIG. 9, R denotes a read command, A denotes an address, and RE denotes a read enable command. A status read command S can be input regardless of whether a read operation is performed. When the status read command S is input, the NBX NAND flash memory 420 generates a status signal SQ after one clock cycle.

The NBX NAND flash memory 420 starts a read operation in response to a read command R. After a read command R and an address A are input, the 420 reads data from a page corresponding to the address A and stores the data in the page buffer 423 (refer to FIG. 6). The NBX NAND flash memory 420 outputs a status signal SQ in response to a status read command S indicating that the NBX NAND flash memory 420 is ready for data transmission.

The NBX NAND flash memory 420 outputs the data stored in the page buffer 423 in response to a read enable command RE. The NBX NAND flash memory 420 outputs the data through a DQ pin according to the toggling of a DQS signal. Data are output from the NBX NAND flash memory 420 in synchronous with the DQS signal. Referring to FIG. 9, data are read from the NBX NAND flash memory 420 at double data rate (DDR).

As explained above, the NBX NAND flash memory of the present invention includes separate C/A and DQ pins. Furthermore, the NBX NAND flash memory includes the SQ register to generate a status signal SQ whenever the flash controller sends a status read command S. Since the CA pin and the DQ pin are separate, read and write speeds can be increased. Furthermore, command and address buses can have a width different from that of a data bus.

Figure 10:
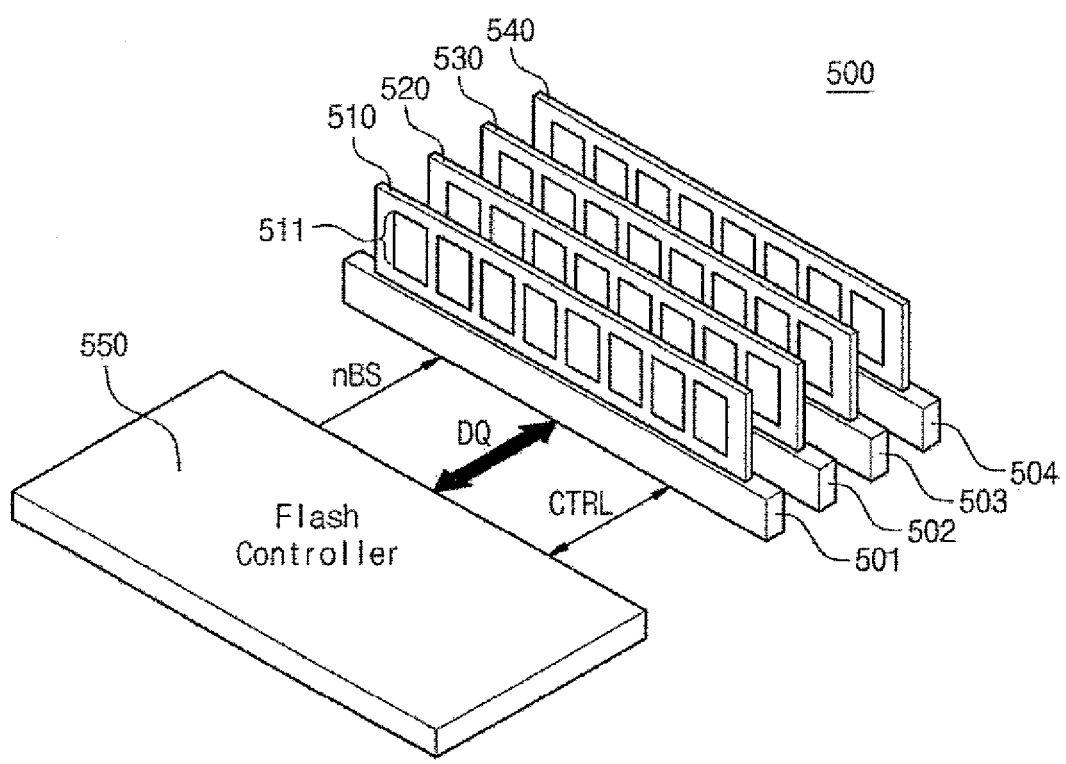
FIG. 10 is a diagram illustrating an NBX NAND flash memory system according to an exemplary embodiment of the present invention.

FIG. 10 is a diagram illustrating an NBX NAND flash memory system 500 according to an exemplary embodiment of the present invention. Referring to FIG. 10, the NBX NAND flash memory system 500 includes a flash controller 550 and a plurality of NBX flash modules 510, 520, 530, and 540. In the exemplary embodiment of FIG. 10, four NBX flash modules are illustrated.

The NBX flash modules 510, 520, 530, and 540 are connected to flash sockets 501, 502, 503, and 504, respectively, and the flash sockets 501, 502, 503, and 504 are connected to the flash controller 550 through a data bus (DQ bus). The NBX flash modules 510, 520, 530, and 540 receive a bank selection (nBS) signal from the flash controller 550. Furthermore, data (DQ) and control (CTRL) signals are transmitted between the flash controller 550 and the NBX flash modules 510, 520, 530, and 540. Each of the NBX flash modules 510, 520, 530, and 540 includes a plurality of NBX NAND flash memories. In the exemplary embodiment shown in FIG. 10, each of the NBX flash modules 510, 520, 530, and 540 includes sixteen NBX NAND flash memories 511.

The flash controller 550 controls write, read, and erase operations of the NBX NAND flash memories of the NBX flash modules 510, 520, 530, and 540. Furthermore, the flash controller 550 performs bank interleaving between banks using the nBS signal.

When it is necessary to update SQ registers of the NBX NAND flash memories of the NBX flash modules 510, 520, 530, and 540, the flash controller 550 can transmit a register value that can be commonly used for all the NBX flash modules 510, 520, 530, and 540. This function of the flash controller 550 is referred to as a broadcasting function. After simultaneously enabling nBS signals for all banks, the flash controller 550 provides a register configuration command (refer to Table 1). The register configuration command is simultaneously provided to each of the NBX NAND flash memories through a C/A pin. Then, the flash controller 550 writes a register value to an SQ register using the C/A pin.

Figure 11:
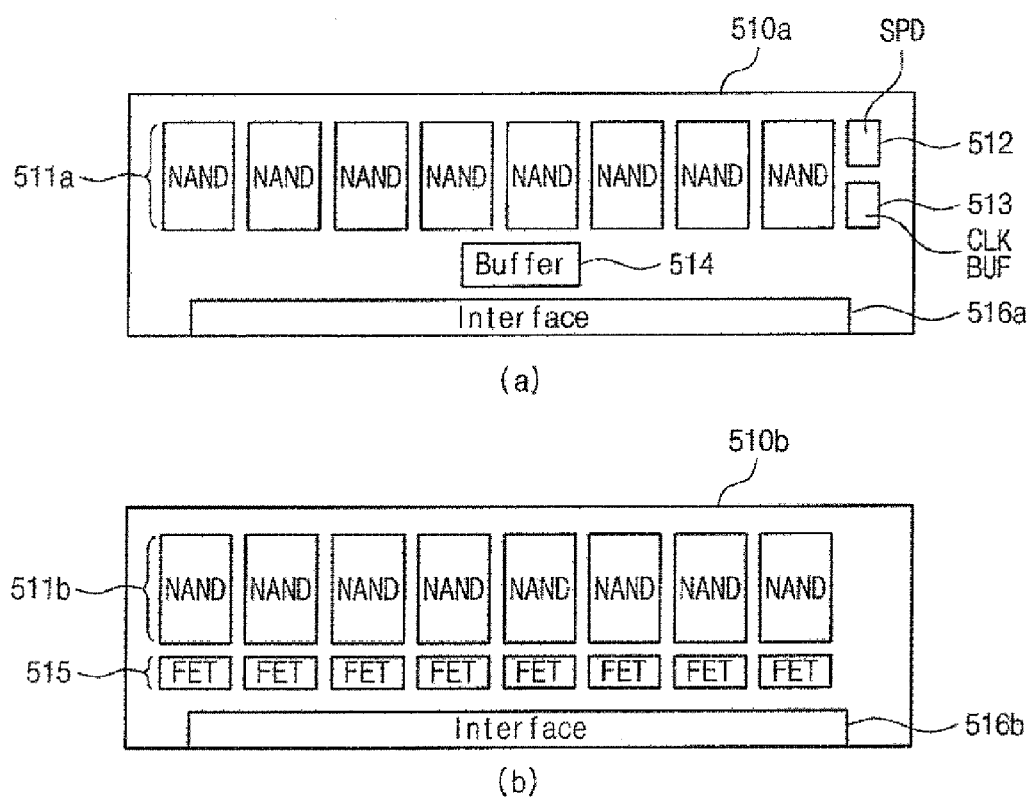
FIG. 11 is a block diagram illustrating an NBX flash module of the NBX NAND flash memory system of FIG. 10, according to an exemplary embodiment of the present invention.

FIG. 11 is a block diagram illustrating an NBX flash module of the NBX NAND flash memory system 500 of FIG. 10, according to an exemplary embodiment of the present invention. In FIG. 11, reference numeral 510*a* denotes a front surface of the NBX flash module 510 of the NBX NAND flash memory system 500, and reference numeral 510*b* denotes a back surface of the NBX flash module 510.

Referring to FIGS. 11 (*a*) and (*b*), eight NBX NAND flash memories 511*a* are formed in the front surface 510*a* of the NBX flash module 510, and eight NBX NAND flash memories 511*b* are formed on the back surface 510*b* of the NBX flash module 510. The eight NBX NAND flash memories 511*a* form one bank, and the eight NBX NAND flash memories 511*b* form another bank. For example, one NBX flash module includes two banks. When each of the NBX NAND flash memories 511*a* and 511*b* has an 8-bit bus width, one bank has a 64-bit bus width.

An electrically erasable programmable read only memory (EEPROM) 512 for status presence detection (SPD), a clock buffer 513, a buffer 514 for C/A and control signals, and an interface 516*a* are formed on the front surface 510*a* of the NBX flash module 510. The EEPROM 512 is used to store data (SPD data) necessary for the flash controller 550 (refer to FIG. 10) to access the NBX flash module 510. The clock buffer 513 is used for distributing a clock signal to the NBX NAND flash memories 511*a* and 511*b*. The buffer 514 is used for distributing command, address, and control signals to the NBX NAND flash memories 511*a* and 511*b*.

Fast enable transfer (FET) switches 515 and an interface 516*b* are formed on the back surface 510*b* of the NBX flash module 510. The FET switches 515 are used to reduce loads on data buses, thereby enabling high-speed data transmission. Since a DDR transmission method is used for the NBX NAND flash memories 511*a* and 511*b*, the FET switches 515 are used to facilitate the use of the DDR transmission method. Each of the FET switches 515 can latch 10 bits: 8 bits for data (DQ), 1 bit for a DQS signal, and 1 bit for a SQ signal. When assembled, the interfaces 516*a* and 516*b* of the NBX flash module 510 are connected to the flash socket 510 (refer to FIG. 10).

Figure 12:
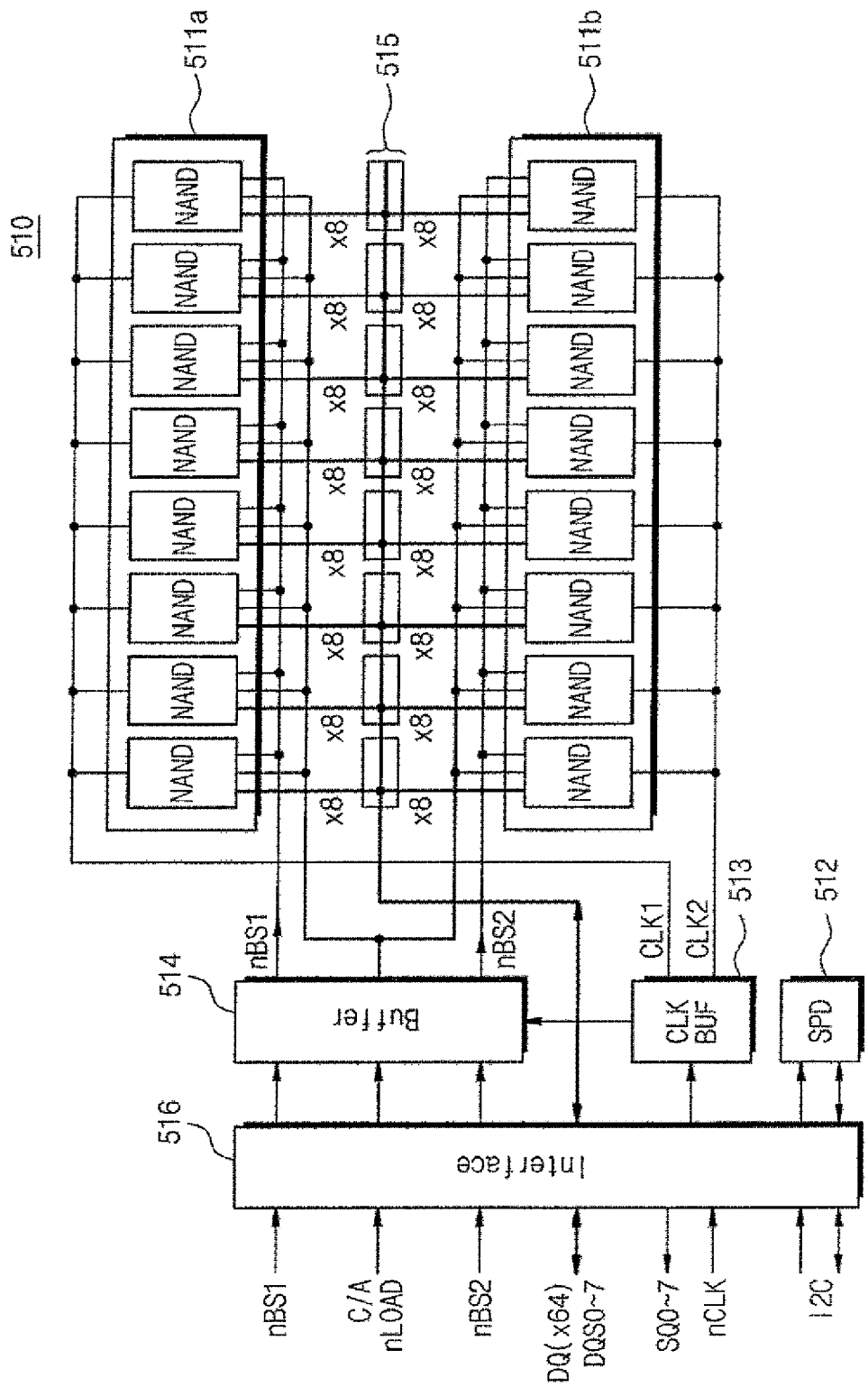
FIG. 12 is a block diagram illustrating an internal structure of the NBX flash module of FIG. 11, according to an exemplary embodiment of the present invention.

FIG. 12 is a block diagram illustrating an internal structure of the NBX flash module 510 of FIG. 11, according to an exemplary embodiment of the present invention. As illustrated in FIG. 11, the NBX flash module 510 includes the NBX NAND flash memories 511*a* and 511*b* (first and second banks), the EEPROM 512 for SPD, the clock buffer 513, the buffer 514 for CIA and control signals, the FET switches 515, and the interface 516.

The interface 516 receives a command, an address, data, first and second bank selection signals nBS1 and nBS2, and an nLOAD signal from the flash controller 550 (refer to FIG. 10). Here, the nBS1 signal is used for selecting the first bank 511*a*, and the nBS2 signal is used for selecting the second bank 511*b*.

The nBS1 signal is provided as a chip enable signal nCE for the NBX NAND flash memories of the first bank 511*a*. The nBS2 signal is provided as a chip nCE signal for the NBX NAND flash memories of the second bank 511*b*. The buffer 514 for CIA and control signals is used to temporarily store a command, an address, and an nLOAD signal and sends them to a selected bank.

The clock buffer 513 receives a clock signal nCLK and generates first and second clock signals CLK1 and CLK2. The first clock signal CLK1 is provided to the first bank 511*a*, and the second clock signal CLK2 is provided to the second bank 511*b*. Furthermore, the clock buffer 513 provides a clock signal for the buffer 514 for C/A and control signals. The buffer 514 is operated in synchronization with a clock signal.

The EEPROM 512 for SPD stores SPD information necessary for the flash controller to access the NBX flash module 510. For example, the EEPROM 512 for SPD stores information about internal delay time necessary for writing data to or reading data from the NBX NAND flash memories of the first and second banks 511*a* and 511*b*. In read or write operation, the flash controller 550 reads the internal delay time information from the EEPROM 512 and outputs signals and data according to the read information for read or write operation.

NBX NAND flash memories included in a given bank have the same page size. Information about this page size is stored in the EEPROM 512. The page size of a NBX NAND flash memory may vary from one bank to another bank and/or from one NBX flash module to another NBX flash module. The EEPROM 512 for SPD stores this page information. When accessing a NBX flash module, the flash controller 550 reads the page information from the EEPROM 512 and operates according to the read page information.

Banks included in one NBX flash module can have different storage capacities. In addition, NBX NAND flash memories included in one bank can have different storage capacities. The EEPROM 512 for SPD stores information about the bank capacities of banks. When accessing a NBX flash module, the flash controller 550 reads the bank capacity information from the EEPROM 512 and operates according to the read bank capacity information. That is, the flash controller 550 reads SPD information from the EEPROM 512 and sets itself using the SPD information.

Figure 13:
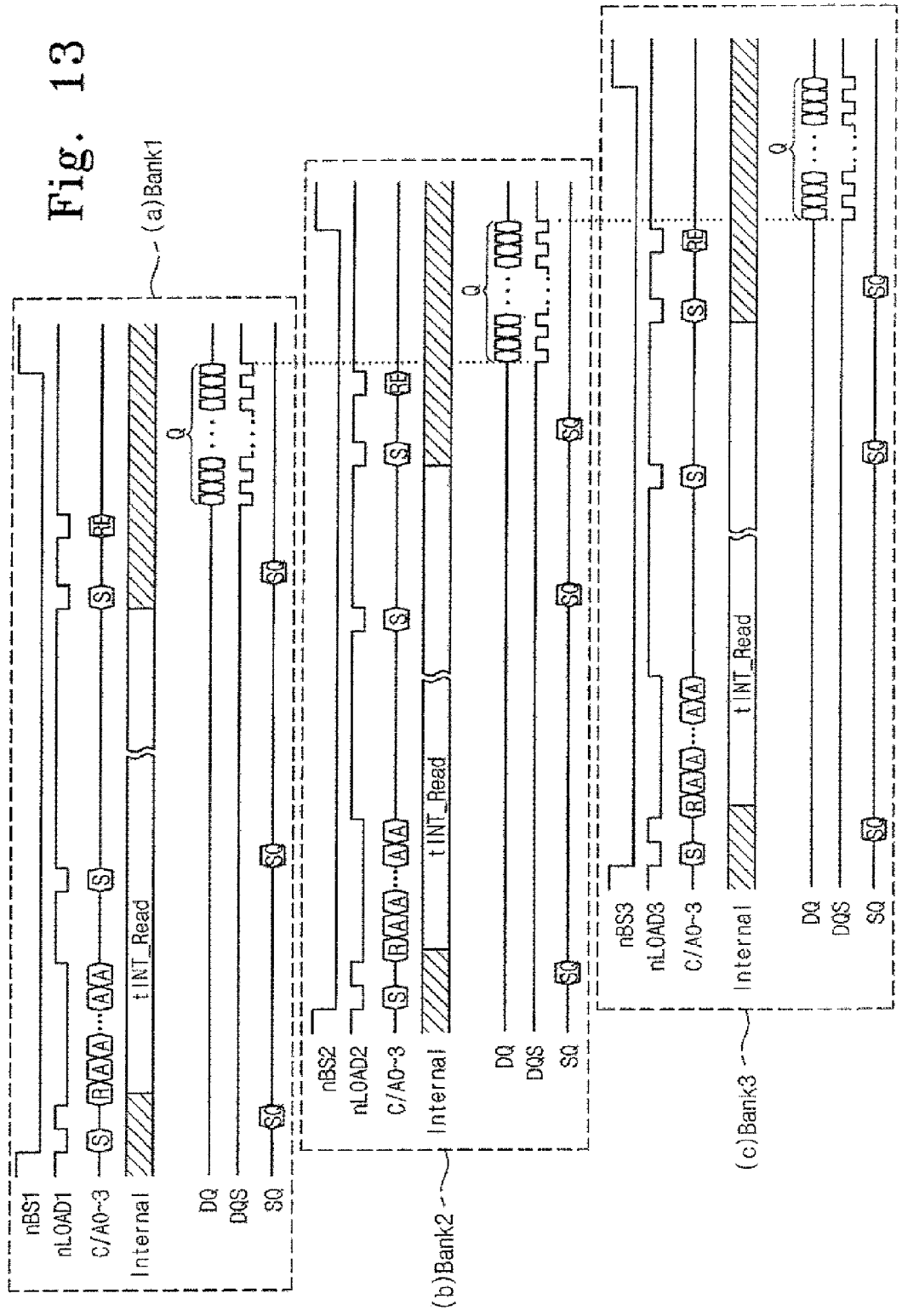
FIGS. 13 through 15 are timing diagrams illustrating a bank interleaving operation of the NBX flash memory system of FIG. 10, according to an exemplary embodiment of the present invention.
Figure 14:
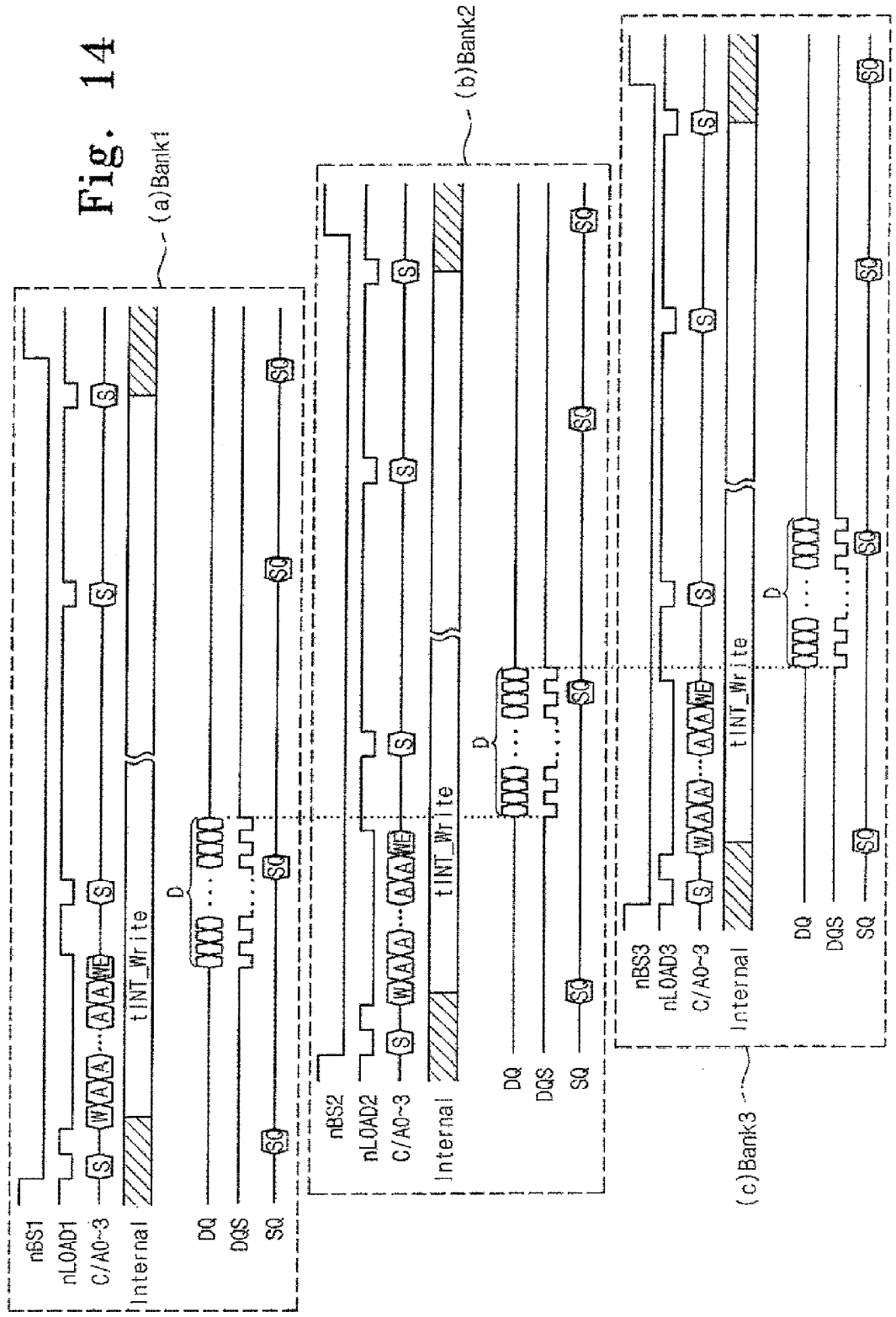
Figure 15:
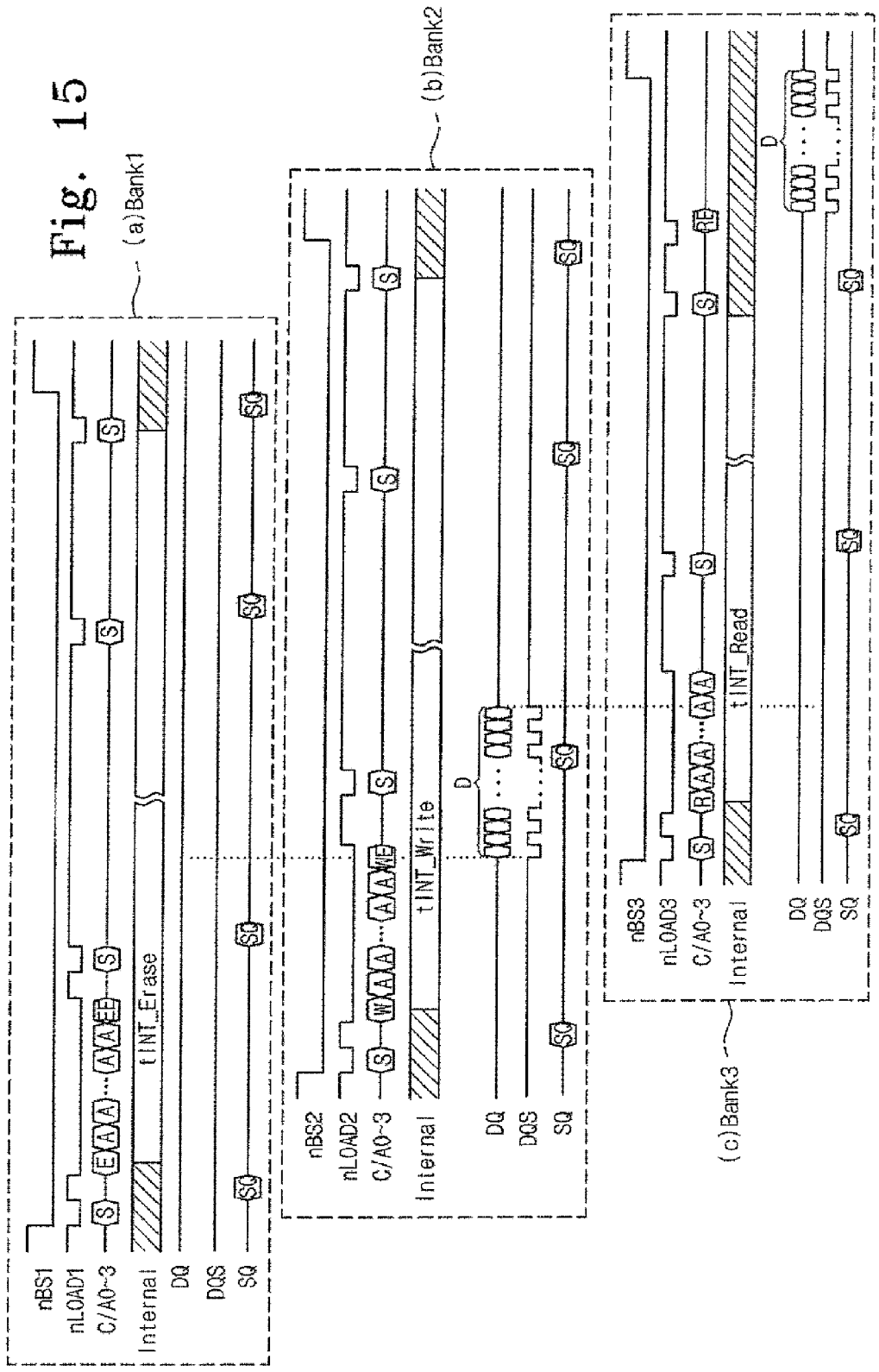

FIGS. 13 through 15 are timing diagrams for explaining a bank interleaving operation of the NBX NAND flash memory system 500 of FIG. 10, according to an exemplary embodiment of the present invention. Bank interleaving is a read, write, or erase operation that is performed alternately on banks. FIG. 13 illustrates an interleaving operation between banks for reading data from the banks. FIG. 14 illustrates an interleaving operation between banks for writing data to the banks. FIG. 15 illustrates an interleaving operation between banks for erasing, writing, and reading.

Referring to FIG. 13, a first bank is enabled by a first bank selection signal nBS1. For example, when the first bank selection signal nBS1 is at a low level, data are read from the first bank. Reading data from the first bank starts in response to a read command R. After the read command R and an address A is input, data are read from a selected page and transmitted to a page buffer. When data corresponding to one page is stored in the page buffer, an NBX NAND flash memory outputs a status signal SQ in response to a status read command S to indicate that it is ready to output data.

The NBX NAND flash memory outputs the data stored in the page buffer in response to a read enable command RE. Here, the NBX NAND flash memory outputs the data through a data input/output pin DQ according to the toggling of a data strobe signal DQS.

When a second bank selection signal nBS2 is changed to a low level during the reading operation for the first bank, data are read from a second bank. Similarly, when a third bank selection signal nBS3 is changed to a low level during the reading operations for the first and second banks, data are read from a third bank. The reading operations for the second and third banks are performed in the same manner as that for the first bank.

After data are output from the first bank, data are output from the second bank without a delay time. Similarly, after data are output from the second bank, data are output from the first bank.

Referring to FIG. 14, when a first bank selection signal nBS1 is at a low level, data are written into a first bank. Writing data into the first bank starts in response to a write command W. After the write command W and an address A are input, a write enable command WE is input. An NBX NAND flash memory receives data through a data input/output pin DQ according to the toggling of a data strobe signal DQS. The received data are stored in a page buffer.

After data are stored in the page buffer, the NBX NAND flash memory performs internal programming on a page of the address A using the stored data. The NBX NAND flash memory outputs a status signal SQ in response to a status read command S to indicate the end of the write operation.

When second and third bank selection signals are changed to a low level during the write operation for the first bank, data are written into second and third banks. The write operations for the second and third banks are performed in the same manner as that for the first bank.

Referring to FIG. 14, after data are completely loaded from a flash controller to a page buffer of the first bank, data are loaded from the flash controller to a page buffer of the second bank without a delay time. Similarly, after the data are loaded to the page buffer of the second bank, data are loaded from the flash controller to a page buffer of the third bank.

Referring to FIG. 15, an erase operation is performed on a first bank, a write operation is performed on a second bank, and a read operation is performed on a third bank. During the erase operation for the first bank, the write operation for the second bank is performed. In addition, during the erase and write operations for the first and second banks, the read operation for the third bank is performed.

Since a conventional NAND flash memory uses a data input/output pin DQ for receiving command and address signals as well as data, a data stream in a data bus or channel is often interrupted. Furthermore, a conventional NAND flash memory module has a long data delay time during an bank interleaving operation. However, as illustrated in FIGS. 13 through 15, the NBX flash module of exemplary embodiments of the present invention can perform an interleaving operation for data input/output without a data delay time, so that data can be read from and written to the NBX flash module at a high speed.

Figure 16:
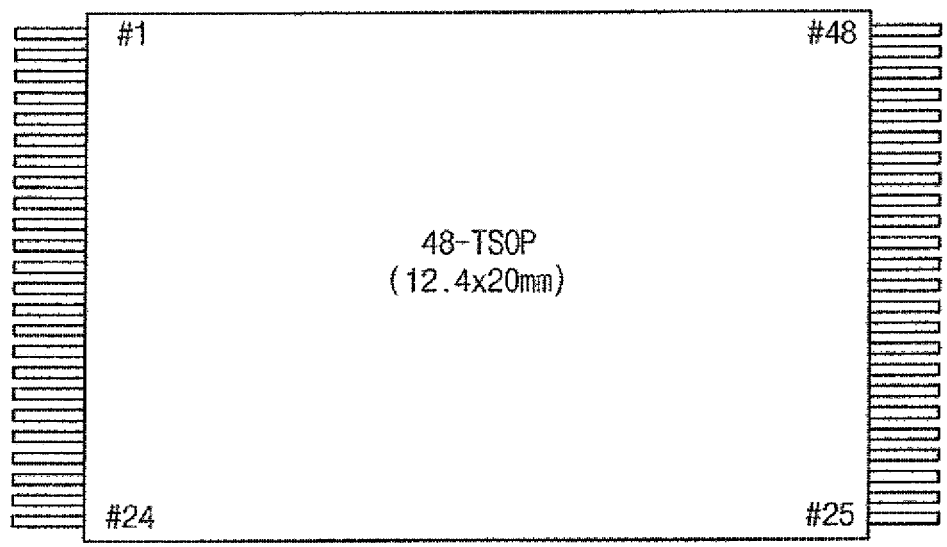
FIG. 16 illustrates a thin small outline package (TSOP) of an NBX NAND flash memory according to an exemplary embodiment of the present invention.

FIG. 16 illustrates a thin small outline package (TSOP) of an NBX NAND flash memory according to an exemplary embodiment of the present invention, and FIG. 17 is a table providing descriptions of pins of the TSOP of FIG. 16, according to an exemplary embodiment of the present invention. Referring to FIG. 16, the NBX NAND flash memory has 48 pins. The 1st to 24th pins are formed on the left side, and the 25th to 48th pins are formed on the right side. Referring to FIG. 17, all control functions are assigned to the left-side pins. According to exemplary embodiments of the present invention, the number of pins can be decreased, and the NBX NAND flash memory can be designed to have all controls pins on one side. Therefore, the NBX NAND flash memory can have a simple structure.

As described above, in the NAND flash memory of exemplary embodiments of the present invention, the C/A pin is separated from the data input/output pin. Therefore, data input/output speed can be improved. Furthermore, the NAND flash memory can perform a bank interleaving operation with less delay time.

The above-disclosed subject matter is to be considered illustrative, and not restrictive. It will be understood by those of ordinary skill in the art that various changes in form and details may be made without departing from the spirit and scope of the present invention.

What is claimed is:

1. A NAND flash memory device, comprising:
a memory cell array having a plurality of memory blocks;
a page buffer configured to store temporally write data to be written to the memory cell array or to store temporally read data from the memory cell array;
a data I/O circuit configured to transfer the write data from an external device to the page buffer in response to a clock signal or to output the read data in response to the clock signal;
a status register configured to output status data of the NAND flash memory device to the external device in response to the clock signal; and
a control logic configured to input command and address from the external device and control the page buffer, the data I/O circuit in response to the command and the address in a program operation, a read operation, or an erase operation,
wherein the status data of the NAND flash memory device indicates whether or not to perform an erase, write, or read operation,
wherein the write data are inputted and read data are outputted according to a double data rate (DDR) transmission method, and
wherein the status data are outputted in accordance with a transmission method that is not the DDR transmission method in association with the erase, write, or read operation,
wherein the status register outputs the status data in response to a status read command from the external device.

2. The NAND flash memory of claim 1, wherein the data of the data I/O circuit input or output through a plurality of data lines to/from the external device.

3. The NAND flash memory of claims 1, wherein the data I/O circuit generates and outputs a data strobe signal in response to the clock signal.

4. The NAND flash memory of claim 3, wherein the data strobe signal is transmitted through a data strobe signal line, indicating whether the data in the plurality of data lines is valid.

5. The NAND flash memory of claim 3, wherein the status data are outputted while the read data are outputted.

6. The NAND flash memory of claim 1, further comprising a command address buffer configured to store the command and the address.

7. The NAND flash memory of claim 6, wherein data pins for transferring data are separated from at least one pin for transferring the command and the address.

8. A memory system, comprising:
a plurality of NAND flash memory devices; and
a memory controller connected to the plurality of NAND flash memory devices through a plurality of channels, respectively, the memory controller configured to control the plurality of NAND flash memory devices,
wherein each of the plurality of NAND flash memory includes:
a memory cell array having a plurality of memory blocks;
a page buffer configured to store temporally write data to be written to the memory cell array or to store temporally read data from the memory cell array;

a data I/O circuit configured to transfer the write data from the memory controller to the page buffer in response to a clock signal or to output the read data in response to the clock signal; and a status register configured to output status data of the NAND flash memory device to the memory controller in response to the clock signal; and a control logic configured to input command and address from the memory controller and control the page buffer, the data I/O circuit in response to the command and the address in a program operation, a read operation, or an erase operation, wherein the status data of the NAND flash memory device indicates whether or not to perform an erase, write, or read operation, wherein the write data are inputted and the read data are outputted according to a double data rate (DDR) transmission method, and wherein the status data are outputted in accordance with a transmission method that is not the DDR transmission method in association with the erase, write, or read operation, wherein the status register outputs the status data in response to a status read command from the memory controller.

9. The memory system of claim 8, wherein each of the plurality of channels input and output data and data strobe signal in response to the clock signal.

10. The memory system of claim 8, wherein each of the plurality of NAND flash memory devices further comprises an RnB pin for outputting an RnB signal to the memory controller, wherein the memory controller inhibits any operation until a program operation or a read operation in the respective NANA flash memory device is completed.

11. The memory system of claim 8, wherein the status register outputs the status data in response to a status read command from the memory controller.

12. The memory system of claim 8, wherein the plurality of NAND flash memory devices is integrated as one memory module.

13. The memory system of claim 11, wherein the memory module further comprises a status presence detection information storing device for storing status presence detection information of each of the plurality of NAND flash memory devices for the memory controller to access to memory module.

14. The memory system of claim 12, wherein the memory module further comprises a clock buffer for buffering the clock signal.

15. The memory system of claim 14, wherein the status presence detection information includes information related to an internal delay time necessary in a program operation or read operation.

16. The memory system of claim 14, wherein each of the plurality of NAND flash memory devices performs an bank interleaving operation using the status presence detection information.

17. A driving method of a NAND flash memory device, comprising:

receiving a clock signal from an external device;

receiving a status read command from the external device; and outputting a status data of the NAND flash memory in response to the status read command in synchronization with the clock signal from a status register, wherein the status data of the NAND flash memory indicates whether or not to perform an erase, write, or read operation, wherein the status command is inputted in accordance with a transmission method that is not a double data rate (DDR) transmission method, and wherein the status data are outputted in accordance with a transmission method that is not the DDR transmission method in association with the erase, write, or read operation, and wherein write data of the write operation are inputted and read data of the read operation are outputted according to the DDR transmission method.

18. The driving method of claim 17, further comprising, outputting read data to the external device in synchronized with a data strobe signal.

19. The driving method of claim 18, wherein the status data are outputted while the read data are outputted.

* * * * *